(12) United States Patent
Abouzied et al.

(10) Patent No.: US 11,979,123 B2
(45) Date of Patent: May 7, 2024

(54) RADIO FREQUENCY (RF) SIGNAL POWER DETECTOR USING DIFFERENT POWER RAILS TO RECEIVE CURRENTS FROM WHICH POWER-INDICATING VOLTAGE IS GENERATED

(71) Applicant: QUALCOMM Incorporated, San Diego, CA (US)

(72) Inventors: Mohamed Abouzied, La Jolla, CA (US); Vinod Panikkath, San Diego, CA (US); Li Liu, San Diego, CA (US); Chuan Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/171,270

(22) Filed: Feb. 17, 2023

(65) Prior Publication Data

US 2023/0208370 A1    Jun. 29, 2023

Related U.S. Application Data

(62) Division of application No. 17/470,191, filed on Sep. 9, 2021, now Pat. No. 11,606,070.

(51) Int. Cl.
*H03F 3/45* (2006.01)
*H04B 1/40* (2015.01)

(52) U.S. Cl.
CPC ........... *H03F 3/45475* (2013.01); *H04B 1/40* (2013.01); *H03F 2200/294* (2013.01); *H03F 2200/451* (2013.01)

(58) Field of Classification Search
CPC ............... G01R 21/01; H03F 2200/294; H03F 2200/451; H03F 3/45475; H04B 1/40
See application file for complete search history.

(56) References Cited

U.S. PATENT DOCUMENTS 10,498,291 B2   12/2019   Tsai
11,606,070 B1    3/2023   Abouzied
(Continued)

FOREIGN PATENT DOCUMENTS

| CN | 107733379 A | 2/2018 |
| CN | 110086434 A | 8/2019 |
| EP | 2756549 A1 | 7/2014 |

OTHER PUBLICATIONS

Hossain M (Md)., et al., "Low-Noise Speed-Optimized Large Area CMOS Avalanche Photodetector for Visible Light Communication", Journal of Lightwave Technology, IEEE, USA, vol. 35, No. 11, Jun. 1, 2017, pp. 2315-2324, XP011646552, ISSN: 0733-8724, DOI: 10.1109/JLT.2017.2687822 [retrieved on Apr. 19, 2017] figure 8.

(Continued)

*Primary Examiner* — Nguyen T Vo
(74) *Attorney, Agent, or Firm* — Loza and Loza (57) ABSTRACT

An aspect relates to an apparatus including a radio frequency (RF) signal power detector. The RF signal power detector includes a first current source configured to generate a first current based on a power level of a first RF signal; a transimpedance amplifier (TIA) configured to generate a first voltage based on the first current, wherein the TIA is coupled between a first upper voltage rail and a lower voltage rail; and a second current source configured to generate a second current related to the first current, wherein the first and second current sources are coupled in series between a second upper voltage rail and the lower voltage rail.

10 Claims, 5 Drawing Sheets

(56) References Cited

U.S. PATENT DOCUMENTS

| | | |
|---|---|---|
| 2008/0030279 A1 | 2/2008 | Ojo et al. |
| 2009/0011727 A1 | 1/2009 | Nakamura et al. |
| 2016/0076938 A1 | 3/2016 | Margulis |
| 2018/0269913 A1 | 9/2018 | Shih |
| 2019/0020320 A1 | 1/2019 | Nallani et al. |
| 2021/0250106 A1 | 8/2021 | Ortiz |
| 2022/0390493 A1* | 12/2022 | Costa .................... H03F 1/0211 |

OTHER PUBLICATIONS

International Search Report and Written Opinion—PCT/US2022/041205—ISA/EPO—dated Nov. 18, 2022.

* cited by examiner

RADIO FREQUENCY (RF) SIGNAL POWER DETECTOR USING DIFFERENT POWER RAILS TO RECEIVE CURRENTS FROM WHICH POWER-INDICATING VOLTAGE IS GENERATED

CROSS-REFERENCE TO RELATED APPLICATIONS

The present Application for Patent is a Divisional application of pending U.S. Non-Provisional application Ser. No. 17/470,191, filed Sep. 9, 2021, and assigned to the assignee hereof and hereby expressly incorporated by reference herein as if fully set forth below and for all applicable purposes.

FIELD

Aspects of the present disclosure relate generally to radio frequency (RF) power detectors, and in particular, to an RF signal power detector that receives currents from different power rails from which a power-indicating voltage is generated.

BACKGROUND

A radio frequency (RF) transmitter usually includes a power detector near its output stage to generate a power detection signal indicative of the power of the transmitted RF signal. The power detection signal (e.g., a voltage) may be used for various reasons. For example, a power detection signal may be used to control the power of the transmitted RF signal such that the power level is efficiently set depending on a distance to a target remote device and/or channel conditions. Another example would be to use a power detection signal to prevent too much radiation exposure to a user in proximity to the transmitter. Yet another example would be to use a power detection signal to form directional radiation beams for improved gain in a particular transmit direction.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a radio frequency (RF) signal power detector, including: a first current source configured to generate a first current based on a power level of a first RF signal; a transimpedance amplifier (TIA) configured to generate a first voltage based on the first current, wherein the TIA is coupled between a first upper voltage rail and a lower voltage rail; and a second current source configured to generate a second current related to the first current or the first voltage, wherein the first and second current sources are coupled in series between a second upper voltage rail and the lower voltage rail.

Another aspect of the disclosure relates to a method. The method includes generating a first current flowing from a first voltage rail to a second voltage rail, wherein the first current is related to a power level of a radio frequency (RF) signal; generating a second current flowing from a third voltage rail to the second voltage rail, wherein the second current is related to the power level of the RF signal; and generating a power-indicating voltage related to the first current.

Another aspect of the disclosure relates to an apparatus. The apparatus includes means for generating a first current flowing from a first voltage rail to a second voltage rail, wherein the first current is related to a power level of a radio frequency (RF) signal; means for generating a second current flowing from a third voltage rail to the second voltage rail, wherein the second current is related to the power level of the RF signal; and means for generating a power-indicating voltage related to the first current.

Another aspect of the disclosure relates to a wireless communication device. The wireless communication device includes a transceiver configured to process a transmit signal to generate a radio frequency (RF) transmit signal; at least one antenna configured to wirelessly transmit the RF transmit signal; a signal sampler configured to generate a sampled RF signal related to the RF transmit signal; and an RF signal power detector, including: a first current source configured to generate a first current based on a power level of the sampled RF signal; a transimpedance amplifier (TIA) configured to generate a first voltage based on the first current, wherein the TIA is coupled between first and second voltage rails; and a second current source configured to generate a second current related to the first current, wherein the first and second current sources are coupled in series between a third voltage rail and the second voltage rail.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
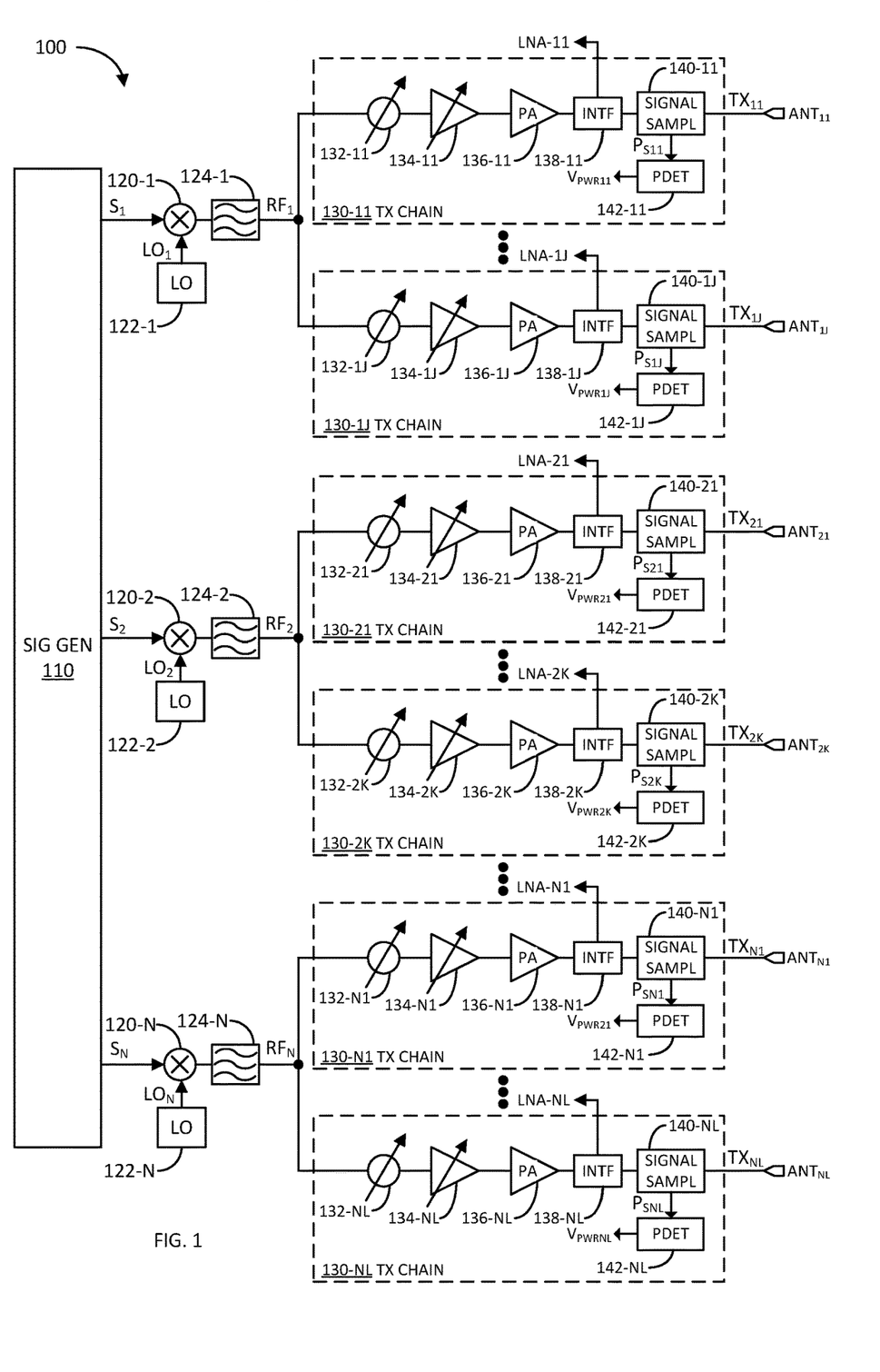
FIG. 1 illustrates a schematic/block diagram of an example radio frequency (RF) signal transmitter in accordance with an aspect of the disclosure.

FIG. 1 illustrates a schematic/block diagram of an example radio frequency (RF) signal transmitter 100 in accordance with an aspect of the disclosure. The RF signal transmitter 100 is an example of a transmitter that includes many transmit chains. The RF signal transmitter 100 may be configured to transmit RF signals with frequencies in microwave/millimeter wave ranges (e.g., a relatively low frequency band 24.25 to 29.5 giga Hertz (GHz) and a relatively high frequency band 37 to 48 GHz). Although these frequency ranges or bands serve to exemplify the concepts described herein, it shall be understood that the concepts are not limited to such frequency ranges.

The RF signal transmitter 100 includes a signal generator 110, a set of mixers 120-1 to 120-N, a set of local oscillators (LO) 122-1 to 122-N, a set of RF filters 124-1 to 124-N, and various sets of transmit chains 130-11-130-1J, 130-21-130-2K to 130-N1-130NL, where N, J, K, and L are positive integers. Each of the transmit chains (130-11-130-1J, 130-21-130-2K to 130-N1-130NL) may include a variable phase shifter (132-11-132-1J, 132-21-132-2K to 132-N1-132NL), a variable-gain pre-amplifier (134-11-134-1J, 134-21-134-2K to 134-N1-134NL), a power amplifier (PA) (136-11-136-1J, 136-21-136-2K to 136-N1-136NL), a power amplifier-low noise amplifier (PA-LNA) interface (138-11-138-1J, 138-21-138-2K to 138-N1-138NL), a signal sampler (140-11-140-1J, 140-21-140-2K to 140-N1-140NL), and an RF signal power detector (142-11-142-1J, 142-21-142-2K to 142-N1-142NL). The RF signal transmitter 100 may include or be associated with sets of antennas $ANT_{11}$-$ANT_{1J}$, $ANT_{21}$-$ANT_{2K}$ to $ANT_{N1}$-$ANT_{NL}$. It shall be understood that the transmit chains may be configured differently.

The signal generator 110 may be configured to generate a set of baseband (BB) or intermediate frequency (IF) transmit signals $S_1$ to $S_N$. The set of BB or IF transmit signals $S_1$ to $S_N$ may include data for transmission in the case of a wireless communication application, and/or may include a certain pattern (e.g., periodic pulses, random or pseudo-random pulses, predetermined sequence of pulses, etc.) in the case of a radar application. The signal generator 110 may include a set of outputs, at which the set of BB or IF transmit signals $S_1$ to $S_N$ are generated, coupled to a first set of inputs of the set of mixers 120-1 to 120-N, respectively.

The set of LOs 122-1 to 122-N are configured to generate a set of local oscillator (LO) signals $LO_1$ to $LO_N$, respectively. The set of LOs 122-1 to 122-N include a set of outputs, at which the set of LO signals $LO_1$ to $LO_N$ are generated, coupled to a second set of inputs of the set of mixers 120-1 to 120-N, respectively. The set of mixers 120-1 to 120-N are configured to mix the set of BB or IF transmit signals $S_1$ to $S_N$ with the set of LO signals $LO_1$ to $LO_N$ to generate a set of mixed signals at a set of outputs of the set of mixers 120-1 to 120-N, respectively. The set of RF filters 124-1 to 124-N are coupled to the set of outputs of the set of mixers 120-1 to 120-N to receive and filter the set of mixed signals to generate a set of RF transmit signals $RF_1$ to $RF_N$, respectively. The set of RF transmit signals $RF_1$ to $RF_N$ are applied to inputs of the sets of transmit chains 130-11-130-1J, 130-21-130-2K to 130-N1-130NL, respectively. Although the RF signal transmitter 100 is an example of a transmitter system that may be used in microwave/millimeter wave applications, it shall be understood that other transmitter or transceiver designs are applicable to the concepts described herein, such as transmitters or transceivers where some components are optional or located in different parts of the system (e.g., the RF filters located at different system locations, or phase shifters being optional, etc.).

Each of the transmit chains (130-11-130-1J, 130-21-130-2K to 130-N1-130NL) is configured to phase shift the RF transmit signal ($RF_1$ to $RF_N$) using the variable phase shifter (132-11-132-1J, 132-21-132-2K to 132-N1-132NL), amplify the RF transmit signal ($RF_1$ to $RF_N$) using the variable-gain pre-amplifier (134-11-134-1J, 134-21-134-2K to 134-N1-134NL), power amplify the RF transmit signal ($RF_1$ to $RF_N$) using the power amplifier (PA) (136-11-136-1J, 136-21-136-2K to 136-N1-136NL), pass the RF transmit signal ($RF_1$ to $RF_N$) to the signal sampler (while passing an RF received signal to an LNA (LNA-11-LNA-1J, LNA-21-LNA-2K to LNA-N1-LNA-NL)) using the PA-LNA interface (138-11-138-1J, 138-21-138-2K to 138-N1-138NL), generate a sampled RF signal ($P_{S11}$-$P_{S1J}$, $P_{S21}$-$P_{S2K}$ to $P_{SN1}$-$P_{SNL}$) using the signal sampler (140-11-140-1J, 140-21-140-2K to 140-N1-140NL), and generate a power-indicating signal or voltage ($V_{PWR11}$-$V_{PWR1J}$, $V_{PWR21}$-$V_{PWR2K}$ to $V_{PWRN1}$-$V_{PWRNL}$) using an RF signal power detector (142-11-142-1J, 142-21-142-2K to 142-N1-142NL). Although, in this example, the RF signal transmitter 100 is shown to be part of a transceiver system with antennas common to both the transmitter- and receiver-sides, it shall be understood that the RF signal transmitter 100 may have dedicated antennas.

Accordingly, the transmit chains 130-11-130-1J, 130-21-130-2K to 130-N1-130NL are configured to generate a set of transmit signals $TX_{11}$-$TX_{1J}$, $TX_{21}$-$TX_{2K}$ to $TX_{N1}$-$TX_{NL}$ based on the set of RF transmit signals $RF_1$ to $RF_N$, respectively. The set of transmit signals $TX_{11}$-$TX_{1J}$, $TX_{21}$-$TX_{2K}$ to $TX_{N1}$-$TX_{NL}$ are provided to the set of antennas $ANT_{11}$-$ANT_{1J}$, $ANT_{21}$-$ANT_{2K}$ to $ANT_{N1}$-$ANT_{NL}$ for wireless transmission.

As a specific example, the integer N may be four (4), and the integers J, K, and L may be eight (8). In such case, there are four (4) mixers-LOs-RF filters, 32 transmit chains, and 32 antennas. The transmit chains 130-11 to 130-18 and associated antennas $ANT_{11}$ to $ANT_{1J}$ may be configured to generate a first directional transmit radiation beam, where the associated antennas $ANT_{21}$ to $ANT_{28}$ are implemented as a phase array antenna. Similarly, the transmit chains 130-21 to 130-28 and associated antennas $ANT_{21}$ to $ANT_{28}$ may be configured to generate a second directional transmit radiation beam, where the associated antennas $ANT_{21}$ to $ANT_{28}$ are implemented as another phase array antenna. The transmit chains 130-31 to 130-38 and associated antennas $ANT_{31}$ to $ANT_{38}$ may be configured to generate a third directional transmit radiation beam, where the associated antennas $ANT_{31}$ to $ANT_{38}$ are implemented as another phase array antenna. And, the transmit chains 130-41 to 130-48 and associated antennas $ANT_{41}$ to $ANT_{48}$ may be configured to generate a fourth directional transmit radiation beam, where the associated antennas $ANT_{41}$ to $ANT_{48}$ are implemented as another phase array antenna.

Continuing the specific example, the transmit chains 130-11 to 130-18 and associated antennas $ANT_{11}$ to $ANT_{1J}$ may be configured to generate the first directional transmit radiation beam in a relatively low frequency band (e.g., 24.25-29.5 GHz) with a first polarization; the transmit chains 130-21 to 130-28 and associated antennas $ANT_{21}$ to $ANT_{28}$ may be configured to generate a second directional transmit radiation beam in the relatively low frequency band (e.g., 24.25-29.5 GHz) with a second polarization; the transmit chains 130-31 to 130-38 and associated antennas $ANT_{31}$ to $ANT_{38}$ may be configured to generate a third directional transmit radiation beam in a relatively high frequency band (e.g., 37-48 GHz) with a third polarization; and the transmit chains 130-41 to 130-48 and associated antennas $ANT_{41}$ to $ANT_{48}$ may be configured to generate a fourth directional transmit radiation beam in the relatively high frequency band (e.g., 37-48 GHz) with a fourth polarization.

As discussed further herein, the sets of RF signal power detectors 142-11-142-1J, 142-21-142-2K to 142-N1-142-NL may receive power from a particular power rail. Considering the previous specific example, there would be a total of 32 RF signal power detectors consuming power from that power rail. This may require the power rail to supply significant current to the 32 power detectors. Furthermore, the transmit signals $TX_{11}$-$TX_{1J}$, $TX_{21}$-$TX_{2K}$ to $TX_{N1}$-$TX_{NL}$ may each have a relatively large dynamic power range. Thus, the RF signal power detectors 142-11-142-1J, 142-21-142-2K to 142-N1-142-NL may also need to be configured to generate power-indicating signals or voltages $V_{PWR11}$-$V_{PWR1J}$, $V_{PWR21}$-$V_{PWR2K}$ to $V_{PWRN1}$-$V_{PWRNL}$ with a similar dynamic voltage range so that the transmit power may be accurately determined. The larger dynamic voltage range for each power detector may translate to a larger current consumption demand due to a higher supply voltage at the power rail to accommodate the larger dynamic voltage range.

Figure 2:
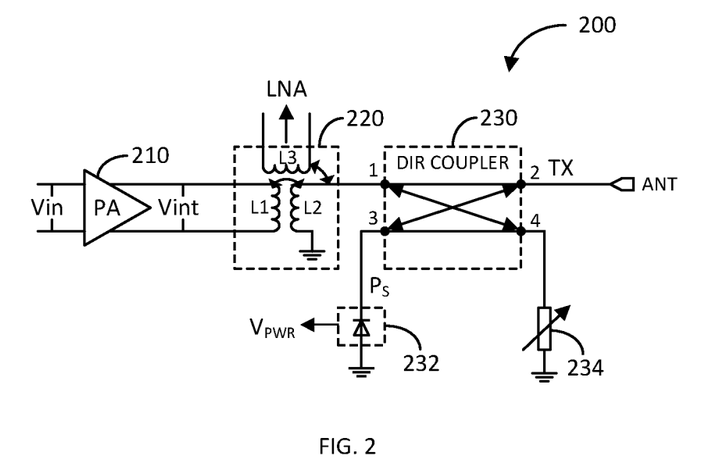
FIG. 2 illustrates a schematic diagram of an example output stage of a radio frequency (RF) transmit chain in accordance with another aspect of the disclosure.

FIG. 2 illustrates a schematic diagram of an example output stage 200 of a radio frequency (RF) transmit chain in accordance with another aspect of the disclosure. The transmit chain output stage 200 may be an example more detailed implementation of the output stage of any of the transmit chains 130-11-130-1J, 130-21-130-2K to 130-N1-130NL previously discussed.

The transmit chain output stage 200 includes a power amplifier (PA) 210, an PA-LNA interface 220, a directional coupler 230, and an RF signal power detector 232. The PA 210 is configured to power amplify an input transmit signal Vin received at differential inputs to generate an intermediate transmit signal Vint at differential outputs. The input transmit signal Vin may have been generated by a corresponding variable-gain pre-amplifier, as previously discussed.

The PA-LNA interface 220 includes a first transformer winding L1, a second transformer winding L2, and a third transformer winding L3. The differential outputs of the PA 210 are coupled to both terminals of the first transformer winding L1, respectively. The first transformer winding L1 is inductively or electromagnetically coupled to the second transformer winding L2. The second transformer winding L2 is also inductively or electromagnetically coupled to the third transformer winding L3. An LNA (not shown) may include differential inputs coupled to both terminals of the third transformer winding L3, respectively. The second transformer winding L2 includes a first (upper) terminal coupled to a first port "1" of the directional coupler 230, and a second (lower) terminal coupled to a lower voltage rail (e.g., at ground potential).

The directional coupler 230 includes a second port "2" coupled a corresponding antenna, a third port "3" coupled to the RF signal power detector 232, and a fourth port "4" coupled to a termination load 234, which may be implemented as a variable resistor. The PA-LNA interface 220 may be configured to substantially pass the intermediate transmit signal Vint from the first transformer winding L1 to the second transformer winding L2. The directional coupler 230 may also be configured to substantially pass the intermediate transmit signal from its first port "1" to its second port "2" to generate a corresponding transmit signal TX, which is provided to the antenna for wireless transmission.

The directional coupler 230 is also configured to generate a sampled power signal ($P_S$) at its third port "3" with a power level substantially proportional to the power level of the transmit signal TX. For example, if the directional coupler 230 has a coupling ratio of 10 dB, then the sampled power signal ($P_S$) has substantially a power level 1/10 of the signal Vint at port "1" of the directional coupler 230 (and the transmit signal TX at port "2" has a power level of substantially 9/10 of the transmit signal at port "1"). If the directional coupler 230 has a coupling ratio of 6 dB, then the sampled power signal ($P_S$) has substantially a power level 1/4 of the transmit signal at port "1" of the directional coupler 230 (and the transmit signal TX at port "2" has a power level of substantially 3/4 of the transmit signal at port "1").

The RF signal power detector 232 is configured to generate a power-indicating signal or voltage $V_{PWR}$, which is substantially proportional to the sampled power signal ($P_S$). As the sampled power signal ($P_S$) is substantially proportional to the power level of the transmit signal TX, then the power-indicating signal or voltage $V_{PWR}$ is also substantially proportional to the power level of the transmit signal TX, and may be used to monitor and/or control the power level of the transmit signal TX.

Figure 3:
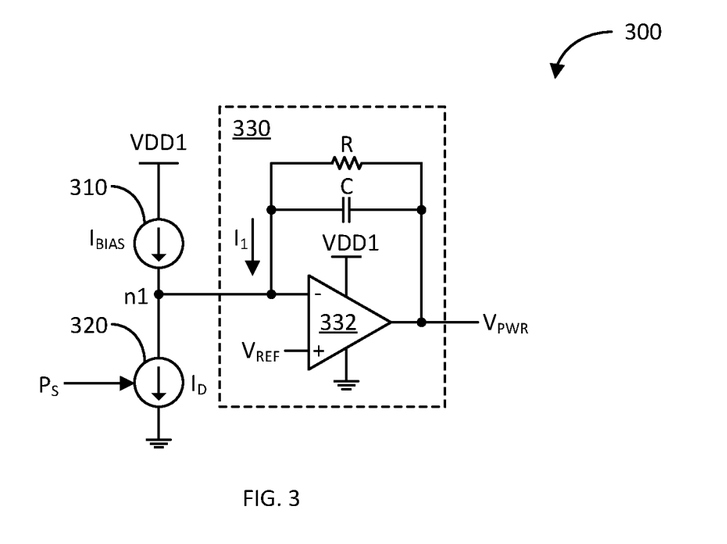
FIG. 3 illustrates a schematic diagram of an example radio frequency (RF) signal power detector in accordance with another aspect of the disclosure.

FIG. 3 illustrates a schematic diagram of an example radio frequency (RF) signal power detector 300 in accordance with another aspect of the disclosure. The RF signal power detector 300 may be an example detailed implementation of any of the RF signal power detectors 142-11-142-1J, 142-21-142-2K to 142-N1-142-NL of the RF signal transmitter 100 or the RF signal power detector 232 of the transmit chain output stage 200, previously discussed.

The RF signal power detector 300 includes a first current source 310 coupled in series with a second current source 320 between an upper voltage rail VDD1 and a lower voltage rail (e.g., at ground potential). The first current source 310 is configured to generate a substantially constant bias current $I_{BIAS}$. The second current source 320 is configured to generate a current $I_D$ based on a sampled power signal ($P_S$) received from a signal sampler or directional coupler, as previously discussed. The second current source 320 (as well as other similar current sources 520, 620, and 720 described herein) may be implemented with a common source field effect transistor (FET), a common gate FET, a common drain FET, or other device configured to convert power into current.

The RF signal power detector 300 further includes a transimpedance amplifier (TIA) 330 including an operational amplifier 332, a feedback resistor R, and a feedback capacitor C. A node n1, between the first and second current sources 310 and 320, is coupled to a first (e.g., negative) input of the operational amplifier 332. The operational amplifier 332 includes a second (e.g., positive input) configured to receive a direct current (DC) reference voltage $V_{REF}$. The operational amplifier 332 receives power from and is coupled between the upper voltage rail VDD1 and the lower voltage rail (e.g., at ground potential). The feedback resistor R and feedback capacitor C are coupled in parallel between an output and the first (e.g., negative) input of the operational amplifier 332. The TIA 330 is configured to generate (at the output of the operational amplifier 332) a power-indicating voltage $V_{PWR}$ related to a power level of a transmit signal TX previously discussed.

In operation, the current $I_D$ generated by the second current source 320 is substantially equal to the sum of the bias current $I_{BIAS}$ and a current $I_1$ generated by the operational amplifier 332 (e.g., $I_D=I_{BIAS}+I_1$). Since, as discussed, $I_{BIAS}$ is substantially constant, the current $I_1$ is therefore related or proportional to the power level of the sampled power signal ($P_S$). Thus, when there is no transmit signal TX, the current $I_D$ generated by the second current source 320 is substantially equal to the bias current $I_{BIAS}$. The current $I_1$ generated at the output of the operational amplifier 332 flows through the feedback resistor R to generate the power-indicating voltage $V_{PWR}$, which may be given by the following equation: $V_{PWR}=I_1*R+V_{REF}$. As the current $I_1$ is related or proportional to the power level of the sampled power signal ($P_S$), which, in turn, is related or proportional to the power level of the transmit signal TX, the power-indicating voltage $V_{PWR}$ is related or proportional to the power level of the transmit signal TX. Accordingly, the operational amplifier 332 including the feedback resistor R and capacitor C operate as a transimpedance amplifier (TIA) to generate the power-indicating voltage $V_{PWR}$ based on the current $I_D$.

As previously discussed, in certain applications, the transmit signal TX may have a relatively large dynamic power range. So that power-indicating voltage $V_{PWR}$ is able to provide an accurate indication of the power level of the transmit signal TX, the power-indicating voltage $V_{PWR}$ should also have a similar dynamic range. The dynamic range of the power-indicating voltage $V_{PWR}$ is limited by the supply voltage provided to the voltage rail VDD1. Thus, a relatively large dynamic range for the power-indicating voltage $V_{PWR}$ translates to a relatively large supply voltage at the voltage rail VDD1. And a relatively large supply voltage at the voltage rail VDD1 translates to a relatively large supply current from the VDD1 rail to the operational amplifier 332 to generate current $I_1$.

Figure 4:
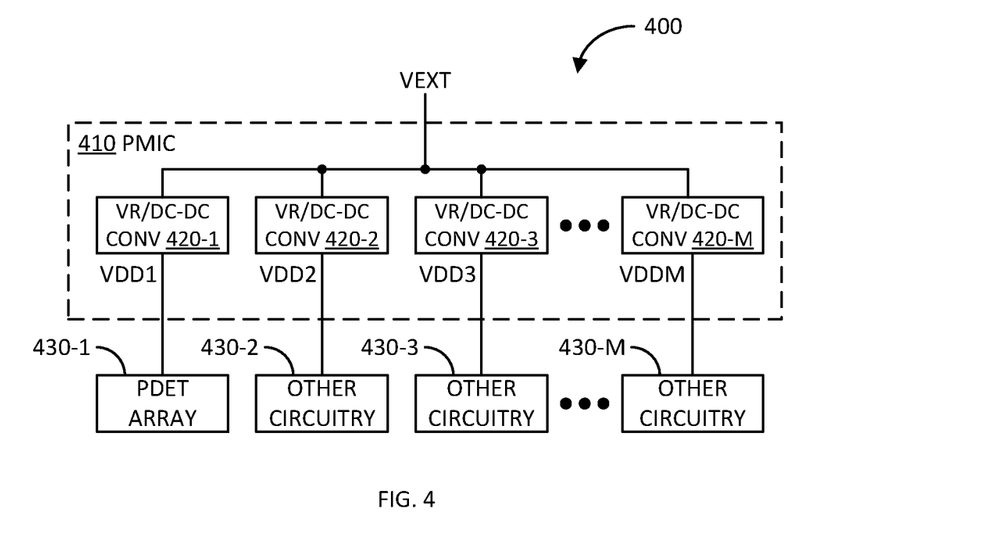
FIG. 4 illustrates a block diagram of an example power distribution circuit in accordance with another aspect of the disclosure.

FIG. 4 illustrates a block diagram of an example power distribution circuit 400 in accordance with another aspect of the disclosure. The power distribution circuit 400 includes a power management integrated circuit (PMIC) 410 including a set of voltage regulators or DC-DC converters (e.g., buck, boost, buck-boost, etc.) 420-1 to 420-M, where M may be a positive integer of two (2) or more. The set of voltage regulators or DC-DC converters 420-1 to 420-M are configured to receive an external supply voltage VEXT from, for example, a battery, an alternating current (AC) adapter (e.g., a Universal Serial Bus (USB) AC adapter), or other supply voltage source. The set of voltage regulators or DC-DC converters 420-1 to 420-M are configured to generate a set of supply voltages VDD1 to VDDM based on the external supply voltage VEXT, respectively. The voltage regulators or DC-DC converters 420-1 to 420-M provide the supply voltages VDD1 to VDDM to a set of circuitry 430-1 to 430-M, respectively, where 430-1 may be a set or array of RF signal power detectors of an RF signal transmitter.

As discussed, the voltage regulator or DC-DC converter 420-1 is configured to supply power (current) to the set or array of power detectors 430-1 of an RF signal transmitter, such as RF signal transmitter 100. If, for example, there are many RF signal power detectors because the RF signal transmitter has many transmit chains (e.g., 32 transmit chains), and the power level of each of the transmit signals $TX_{11}$ to $TX_{NL}$ has a relatively large dynamic power range, the maximum current required by the voltage regulator or DC-DC converter 420-1 may be significantly large. If it is desired to use an existing PMIC 410 configured to supply current to a smaller set or array of RF signal power detectors, the current requirement of the set or array of power detectors 430-1 may exceed the current capability of the voltage regulator or DC-DC converter 420-1, and it may require a redesign of the PMIC 410 to meet the new current requirement, which may not be desirable.

Figure 5:
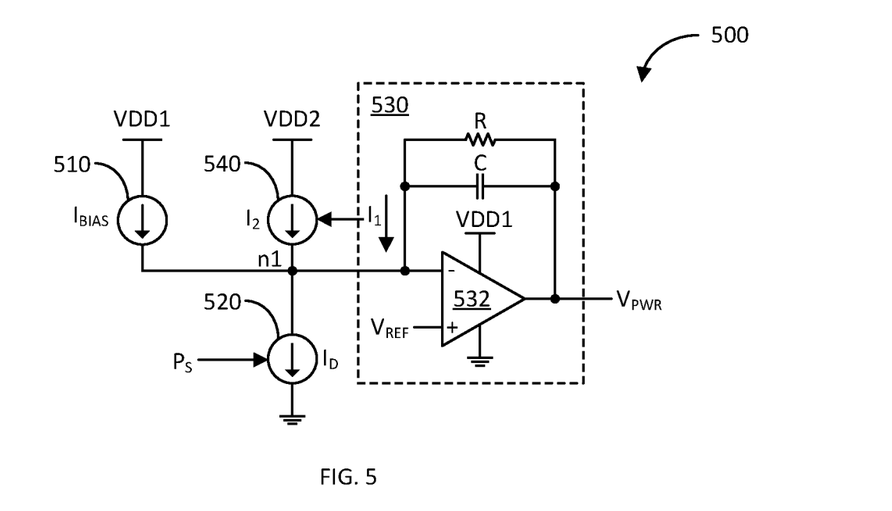
FIG. 5 illustrates a schematic diagram of another example radio frequency (RF) signal power detector in accordance with another aspect of the disclosure.

FIG. 5 illustrates a schematic diagram of another example radio frequency (RF) signal power detector 500 in accordance with another aspect of the disclosure. In certain aspects, the RF signal power detector 500 bleeds in current from an additional voltage rail to generate the current related to or proportional to the power level of the transmit signal TX. This allows the original voltage rail to be used without redesigning the voltage regulator or DC-DC converter used to supply current to the original voltage rail when more power or current demand is required for RF signal power detection.

More specifically, the RF signal power detector 500 includes a first current source 510 and a second current source 520 coupled in series between a first upper voltage rail VDD1 and a lower voltage rail (e.g., at ground potential). The first current source 510 is configured to generate a substantially constant bias current $I_{BIAS}$, and the second current source 520 is configured to generate a current $I_D$ related to a power level of a sampled power signal ($P_S$), which, in turn, is related or proportional to a power level of a transmit signal TX.

The RF signal power detector 500 also includes a transimpedance amplifier (TIA) 530 including an operational amplifier 532, a feedback resistor R, and a feedback capacitor C. A node n1, between the first and second current sources 510 and 520, is coupled to a first (e.g., negative) input of the operational amplifier 532. The operational amplifier 532 includes a second (e.g., positive) input configured to receive a substantially constant DC reference voltage $V_{REF}$. The feedback resistor R and capacitor C are coupled in parallel between an output and the first (e.g., negative) input of the operational amplifier 532. The operational amplifier 532 is configured to generate a current $I_1$ based on the current $I_D$ generated by the second current source 520, which, in turn, is based on the power level of the sampled power signal ($P_S$). The operational amplifier 532 is coupled between and receives power (supply voltage and current) from the first upper voltage rail VDD1 and lower voltage rail (e.g., at ground potential).

As discussed, to reduce the current capability requirement of the first upper voltage rail VDD1, the RF signal power detector 500 receives bleed current from a second upper voltage rail VDD2. In this regard, the RF signal power detector 500 further includes a third current source 540 coupled between the second upper voltage rail VDD2 and the node n1. The third current source 540 is configured to generate a current $I_2$ related or proportional to the current $I_1$ and/or the power-indicating voltage $V_{PWR}$ generated by the operational amplifier 532. The RF power detector 500 may include a feedback circuit to control the current source 540 such that the current $I_2$ is related or proportional to the current $I_1$ and/or the voltage $V_{PWR}$.

As previously discussed, the current $I_1$ and voltage $V_{PWR}$ is related or proportional to the power level of the sampled power signal ($P_S$). Since the current $I_2$ is related or proportional to the current $I_1$ and voltage $V_{PWR}$, the current $I_2$ is also related to or proportional to the power level of the sampled power signal ($P_S$).

In this implementation, the current $I_D$ generated by the second current source 520 may be substantially equal to the sum of the bias current $I_{BIAS}$, and the currents $I_1$ and $I_2$ (e.g., $I_D = I_{BIAS} + I_1 + I_2$). The TIA 530 is configured to generate the power-indicating voltage $V_{PWR}$, which may still be equal to $I_1 * R + V_{REF}$. Note that the bleed current $I_2$ does not contribute to the generation of the power-indicating voltage $V_{PWR}$, but serves to reduce the current capability requirement of the first voltage rail VDD1. The bleed current $I_2$ may be configured to be a scaled version of the current $I_1$ (e.g., $I_2 = \alpha I_1$, where $\alpha < 1$). Thus, at high power level of the transmit signal TX, the bleed current $I_2$ provided by the second upper voltage rail VDD2 reduces the current supplying demand of the first upper voltage rail VDD1. With reference to FIG. 4, the first and second voltage regulators or DC-DC converters 420-1 and 420-2 may be configured to provide supply voltages for the first and second upper voltage rails VDD1 and VDD2, respectively.

Figure 6:
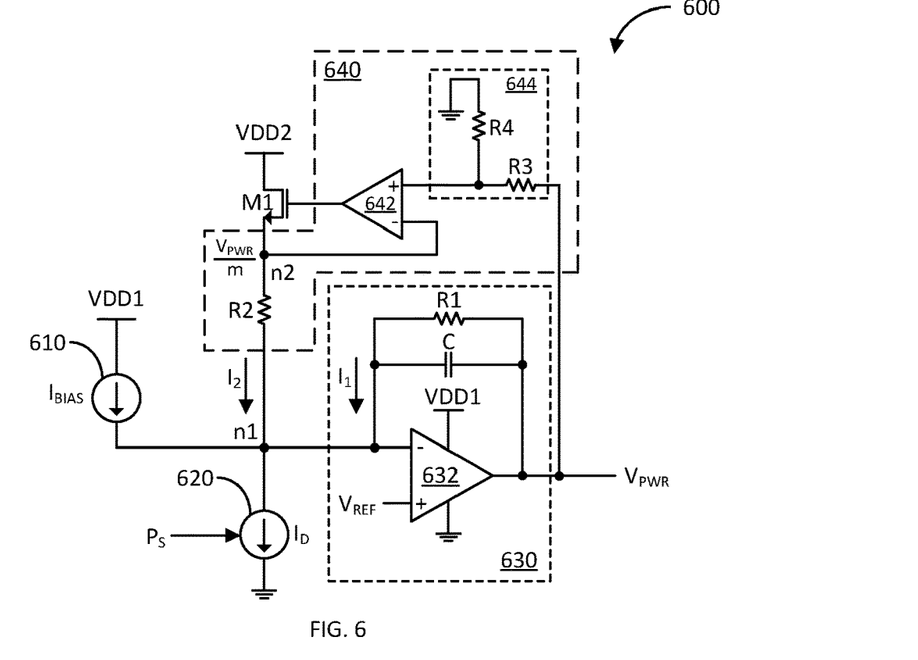
FIG. 6 illustrates a schematic diagram of another example radio frequency (RF) signal power detector in accordance with another aspect of the disclosure.

FIG. 6 illustrates a schematic diagram of another example radio frequency (RF) signal power detector 600 in accordance with another aspect of the disclosure. The RF signal power detector 600 may be an example of a more detailed implementation of the RF signal power detector 500 previously discussed.

More specifically, the RF signal power detector 600 includes a first current source 610 and a second current source 620 coupled in series between a first upper voltage rail VDD1 and a lower voltage rail (e.g., at ground potential). The first current source 610 is configured to generate a substantially constant bias current $I_{BIAS}$, and the second current source 620 is configured to generate a current $I_D$ related to a power level of a sampled power signal ($P_S$), which, in turn, is related or proportional to a power level of a transmit signal TX.

The RF signal power detector 600 also includes a transimpedance amplifier (TIA) 630 including an operational amplifier 632, a feedback resistor R1, and a feedback capacitor C. A first node n1, between the first and second current sources 610 and 620, is coupled to a first (e.g., negative) input of the operational amplifier 632. The operational amplifier 632 includes a second (e.g., positive) input configured to receive a substantially constant DC reference voltage $V_{REF}$. The feedback resistor R1 and capacitor C are coupled in parallel between an output and the first (e.g., negative) input of the operational amplifier 632. The operational amplifier 632 is configured to generate a current $I_1$ based on the current $I_D$ generated by the second current source 620, which, in turn, is based on the power level of the sampled power signal ($P_S$). The operational amplifier 632 is coupled between and receives power (supply voltage and current) from the first upper voltage rail VDD1 and the lower voltage rail (e.g., at ground potential).

As discussed, to reduce the current capability requirement of the first upper voltage rail VDD1, the RF signal power detector 600 includes a current source M1 in the form of a field effect transistor (FET) (e.g., an n-channel metal oxide semiconductor (NMOS) FET) and a control circuit 640 to configure a current $I_2$ generated by the current source FET M1 related or proportional to the current $I_1$ or voltage $V_{PWR}$ generated by the operational amplifier 632. It shall be understood that the current source M1 may be implemented using another type of transistor or device, such as a bipolar junction transistor (BJT) or a laterally-diffused metal-oxide semiconductor (LDMOS).

The control circuit 640 includes an operational amplifier 642, a resistor R2, and a voltage divider 644 including resistors R3 and R4. The current source FET M1 is coupled in series with resistor R2 between a second upper voltage rail VDD2 and the first node n1. The resistor R3 of the voltage divider 644 is coupled between the output of the operational amplifier 632 and a first (e.g., positive) input of the operational amplifier 642. The resistor R4 of the voltage divider 644 is coupled between the first (e.g., positive) input of the operational amplifier 642 and the lower voltage rail (e.g., at ground potential). The operational amplifier 642 includes a second (e.g., negative) input coupled to a second node n2 between the current source FET M1 and resistor R2, and an output coupled to a gate of the current source FET M1.

In operation, the voltage divider 644 is configured to divide the voltage $V_{PWR}$ by a ratio m being equal to R4/(R3+R4), where R3 and R4 represent also the resistances of the resistor R3 and R4, respectively. Thus, the voltage at the first (e.g., positive) input of the operational amplifier 642 is $V_{PWR}/m$. Due to the feedback configuration of the output to the second (e.g., negative) input of the operational amplifier 642 via the gate and source of FET M1, the voltage at node n2 is also substantially at $V_{PWR}/m$. Accordingly, the bleed current $I_2$ generated by the current source FET M1 is substantially equal to $(V_{PWR}/m - V_{REF})/R2$, where R2 represents also the resistance of resistor R2. As the current $I_1$ is substantially equal to $(V_{PWR} - V_{REF})/R1$, both currents $I_1$ and $I_2$ are related to $V_{PWR}$; and thus, the current $I_2$ is related to the current $I_1$, and related to the power level of the sampled power signal $P_S$, and ultimately, the power level of the transmit signal TX.

As previously discussed, the current $I_D$ generated by the second current source 520 may be substantially equal to the sum of the bias current $I_{BIAS}$, and the currents $I_1$ and $I_2$ (e.g., $I_D = I_{BIAS} + I_1 + I_2$). The TIA 630 is configured to generate a power-indicating voltage $V_{PWR}$, which may still be equal to $I_1 * R + V_{REF}$. Note that the bleed current $I_2$ does not contribute to the generation of the power-indicating voltage $V_{PWR}$, but serves to reduce the current demand of the first voltage rail VDD1. The bleed current $I_2$ may be configured to be a scaled version of the current $I_1$ (e.g., $I_2 = \alpha I_1$, where $\alpha < 1$) by selecting the resistances R2-R4 of resistors R2-R4, respectively. Thus, at high power level of the transmit signal TX, the bleed current $I_2$ provided by the second upper voltage rail VDD2 reduces the current supplying requirement of the first upper voltage rail VDD1.

Figure 7:
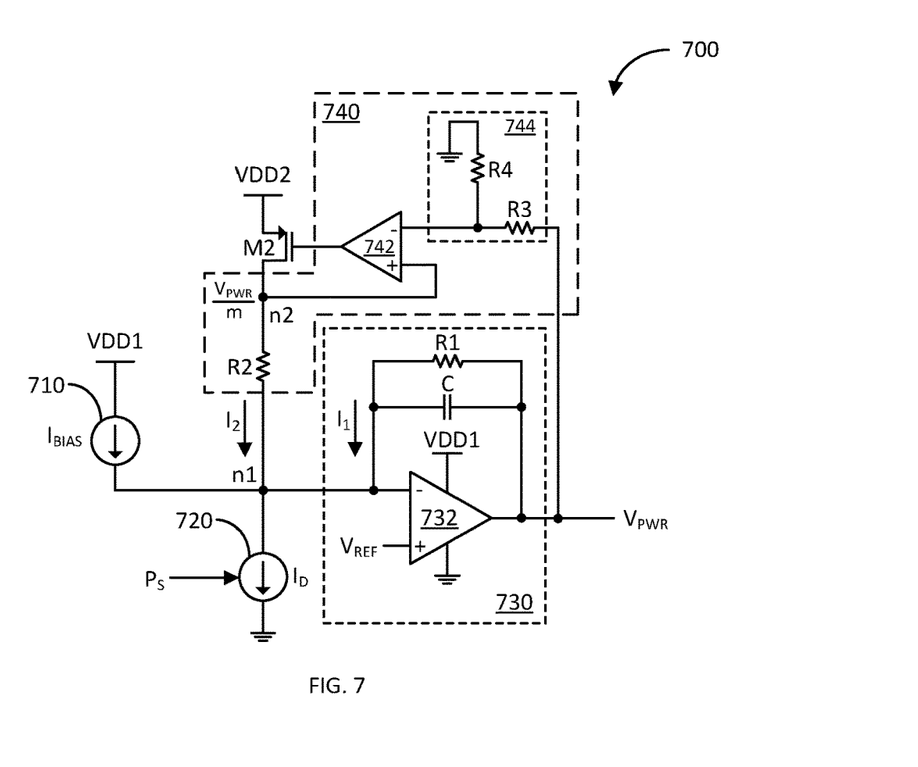
FIG. 7 illustrates a schematic diagram of another example radio frequency (RF) power detector in accordance with another aspect of the disclosure.

FIG. 7 illustrates a schematic diagram of another example radio frequency (RF) signal power detector 700 in accordance with another aspect of the disclosure. The RF signal power detector 700 is a modified version of the RF signal power detector 600 previously discussed, and includes many of the same elements as indicated by the same reference symbols and numbers but with the most significant digit being a "7" in the case of RF signal power detector 700 instead of a "6" in the case of RF signal power detector 600.

The RF signal power detector 700 differs from RF signal power detector 600 in that the current source is implemented as a p-channel metal oxide semiconductor (PMOS) FET M2 instead of the NMOS FET M1. It shall be understood that the current source M2 may be implemented using another type of transistor or device, such as a BJT or an LDMOS. Further, the polarity of the inputs of the operational amplifier 742 is opposite to the polarity of the inputs of the operational amplifier 642. That is, the resistor R3 is coupled between the output of the operational amplifier 732 and the negative input of the operational amplifier 742; and the second node n2 is coupled to the positive input of the operational amplifier 742. The operation of the RF signal power detector 700 is essentially the same as that of the RF signal power detector 600 as previously discussed in detail.

Figure 8:
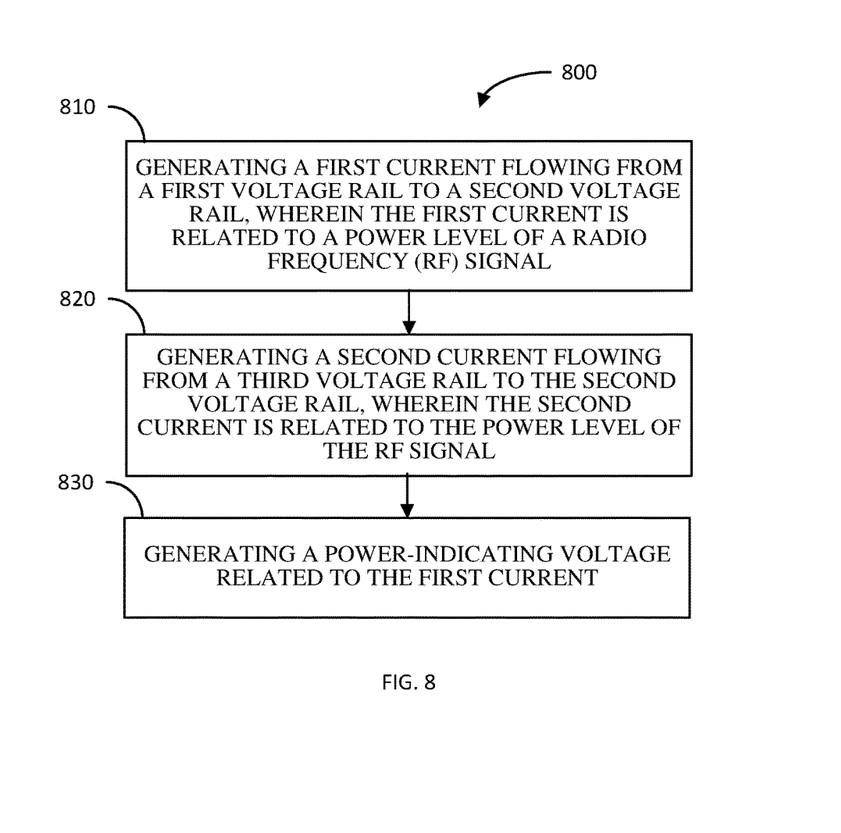
FIG. 8 illustrates a flow diagram of an example method of detecting power of a radio frequency (RF) signal in accordance with another aspect of the disclosure.

FIG. 8 illustrates a flow diagram of an example method 800 of detecting power of a radio frequency (RF) signal in accordance with another aspect of the disclosure. The method 800 includes generating a first current flowing from a first voltage rail to a second voltage rail, wherein the first current is related to a power level of a radio frequency (RF) signal (block 810). Examples of means for generating a first current flowing from a first voltage rail to a second voltage rail, wherein the first current is related to a power level of a radio frequency (RF) signal include any of the current sources 520, 620, and 720.

The method 800 further includes generating a second current flowing from a third voltage rail to the second voltage rail, wherein the second current is related to the power level of the RF signal (block 820). Examples of means for generating a second current flowing from a third voltage rail to the second voltage rail, wherein the second current is related to the power level of the RF signal include any of the current sources 540, M1, and M2.

Additionally, the method 800 includes generating a power-indicating voltage related to the first current (block 830). Examples of means for generating a power-indicating voltage related to the first current include any of the transimpedance amplifiers (TIAs) described herein.

The operation of generating the second current per block 820 may include generating the second current based on the power-indicating voltage. Examples of means for generating the second current based on the power-indicating voltage include the control circuits 640 and 740. The operation of generating the second current per block 820 may include controlling a current source based on the power-indicating voltage. Examples of means for controlling a current source based on the power-indicating voltage include the control circuits 640 and 740.

The method 800 may further include generating a third current related to a sum of the first and second currents. Examples of means for generating a third current related to a sum of the first and second currents include any of the current sources 520, 620, and 720. Additionally, the method 800 may include generating a substantially constant bias current, wherein the third current is related to the sum of the first and second currents and the bias current. Examples of means for generating a substantially constant bias current, wherein the third current is related to the sum of the first and second currents and the bias current include any of the current sources 510, 610, and 710.

Figure 9:
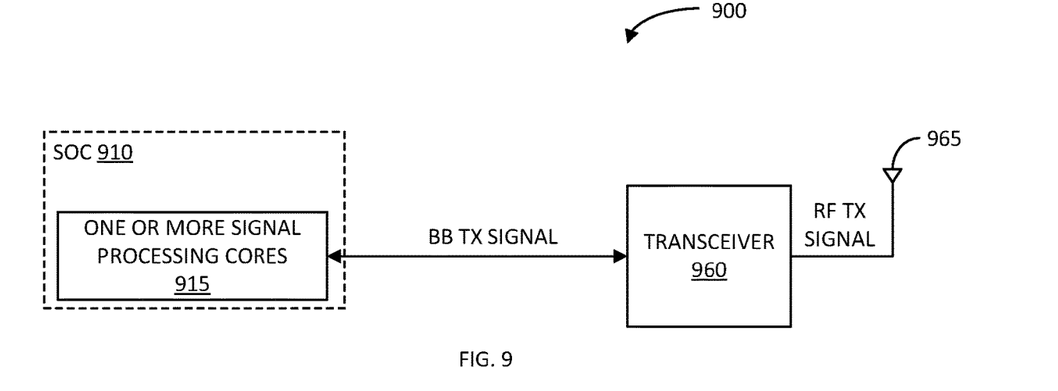
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 may take on various distinct forms, such as a smart phone, tablet wireless device, laptop computer, desktop computer, wearable wireless device (e.g., a smart watch, activity sensing device, health monitoring device, etc.), Internet of Things (IoT) device, etc.

The wireless communication device 900 includes an integrated circuit 910, which may be configured as a system on chip (SOC). The SOC 910 may include one or more signal processing cores 915 configured to process and/or generate a baseband (BB) transmit (TX) signal. The BB transmit signal may include data for wireless transmission to one or more remote devices. The wireless communication device 900 also includes a transceiver 960 configured to process the BB transmit signal to generate an RF transmit signal. Additionally, the wireless communication device 900 includes at least one antenna 965 (e.g., an antenna array) configured to wirelessly transmit the RF transmit signal.

As discussed, the transceiver 960 may include an RF signal power detector to generate a power-indicating signal or voltage indicative of the power level of the RF transmit signal. Although, in this example, the one or more signal processing cores 915, transceiver 960, and at least one antenna 965 have been described with reference to a signal transmission application, it shall be understood that these devices may also be configured to perform operations with regard to a signal reception application.

The following provides an overview of aspects of the present disclosure:

Aspect 1: An apparatus, including: a radio frequency (RF) signal power detector, including: a first current source configured to generate a first current based on a power level of a first RF signal; a transimpedance amplifier (TIA) configured to generate a first voltage based on the first current, wherein the TIA is coupled between a first upper voltage rail and a lower voltage rail; and a second current source configured to generate a second current related to the first current or the first voltage, wherein the first and second current sources are coupled in series between a second upper voltage rail and the lower voltage rail.

Aspect 2: The apparatus of aspect 1, wherein the TIA includes: an operational amplifier including a first input coupled to a node between the first and second current sources, a second input configured to receive a reference voltage, and an output; and a feedback resistor and a feedback capacitor coupled in parallel between the output and the first input of the operational amplifier.

Aspect 3: The apparatus of aspect 1 or 2, wherein the RF signal power detector further includes a third current source configured to generate a substantially constant bias current, wherein the third current source is coupled in series with the first current source between the first upper voltage rail and the lower voltage rail.

Aspect 4: The apparatus of any one of aspects 1-3, wherein the RF signal power detector further includes a control circuit configured to control the second current source based on the first voltage.

Aspect 5: The apparatus of aspect 4, wherein the second current source includes a field effect transistor (FET).

Aspect 6: The apparatus of aspect 5, wherein the FET includes an n-channel metal oxide semiconductor (NMOS) FET.

Aspect 7: The apparatus of aspect 5, wherein the FET includes a p-channel metal oxide semiconductor (PMOS) FET.

Aspect 8: The apparatus of aspect 5, wherein the control circuit includes: a first resistor coupled between the first and second current sources; a voltage divider configured to divide the first voltage to generate a second voltage; and an operational amplifier including a first input configured to receive the second voltage, a second input coupled to a node between the second current source and the first resistor, and an output coupled to a gate of the FET.

Aspect 9: The apparatus of aspect 8, wherein the voltage divider includes: a second resistor coupled between an output of the TIA and the first input of the operational amplifier; and a third resistor coupled between the first input of the operational amplifier and the second voltage rail.

Aspect 10: The apparatus of any one of aspects 1-9, wherein the lower voltage rail is at ground potential.

Aspect 11: The apparatus of any one of aspects 1-10, further comprising first and second voltage regulators or DC-to-DC converters configured to provide first and second supply voltages to the first and second upper voltage rails, respectively.

Aspect 12: The apparatus of any one of aspects 1-11, further including a signal sampler configured to generate the first RF signal based on a second RF signal.

Aspect 13: The apparatus of aspect 12, wherein the signal sampler includes a directional coupler.

Aspect 14: The apparatus of aspect 12 or 13, further including a power amplifier (PA) configured to generate the second RF signal.

Aspect 15: The apparatus of aspect 14, further including a power amplifier-low noise amplifier (PA-LNA) interface coupled to the PA, the signal sampler, and a low noise amplifier (LNA).

Aspect 16: The apparatus of aspect 15, wherein the PA-LNA interface includes: a first transformer winding coupled to an output of the PA; a second transformer winding electromagnetically coupled to the first transformer winding, and coupled to the signal sampler; and a third transformer winding electromagnetically coupled to the second transformer winding, and coupled to an input of the LNA.

Aspect 17: The apparatus of any one of aspects 10-16, further including an antenna coupled to the signal sampler.

Aspect 18: The apparatus of any one of aspects 1-17, further comprising a transceiver including a set of power amplifiers (PAs) configured to generate a set of millimeter-wave RF signals, wherein the RF signal power detector is coupled to at least one of the set of PAs.

Aspect 19: A method, including: generating a first current flowing from a first voltage rail to a second voltage rail, wherein the first current is related to a power level of a radio frequency (RF) signal; generating a second current flowing from a third voltage rail to the second voltage rail, wherein the second current is related to the power level of the RF signal; and generating a power-indicating voltage related to the first current.

Aspect 20: The method of aspect 19, wherein generating the second current includes generating the second current based on the power-indicating voltage.

Aspect 21: The method of aspect 20, wherein generating the second current includes controlling a current source based on the power-indicating voltage.

Aspect 22: The method of any one of aspects 19-21, further including generating a third current related to a sum of the first and second currents.

Aspect 23: The method of aspect 22, further including generating a substantially constant bias current, wherein the third current is related to the sum of the first and second currents and the bias current.

Aspect 24: An apparatus, including: means for generating a first current flowing from a first voltage rail to a second voltage rail, wherein the first current is related to a power level of a radio frequency (RF) signal; means for generating a second current flowing from a third voltage rail to the second voltage rail, wherein the second current is related to the power level of the RF signal; and means for generating a power-indicating voltage related to the first current.

Aspect 25: The apparatus of aspect 24, wherein the means for generating the second current includes means for generating the second current based on the power-indicating voltage.

Aspect 26: A wireless communication device, including: a transceiver configured to process a transmit signal to generate a radio frequency (RF) transmit signal; at least one antenna configured to wirelessly transmit the RF transmit signal; a signal sampler configured to generate a sampled RF signal related to the RF transmit signal; and an RF signal power detector, including: a first current source configured to generate a first current based on a power level of the sampled RF signal, a transimpedance amplifier (TIA) configured to generate a first voltage based on the first current, wherein the TIA is coupled between first and second voltage rails, and a second current source configured to generate a second current related to the first current or the first voltage, wherein the first and second current sources are coupled in series between a third voltage rail and the second voltage rail.

Aspect 27: The wireless communication device of aspect 26, wherein the RF signal power detector further includes a control circuit configured to control the second current source based on the first voltage.

Aspect 28: The wireless communication device of aspect 27, wherein the second current source includes a field effect transistor (FET).

Aspect 29: The wireless communication device of aspect 28, wherein the control circuit includes: a resistor coupled between the first and second current sources; a voltage divider configured to divide the first voltage to generate a second voltage; and an operational amplifier including a first input configured to receive the second voltage, a second input coupled to a node between the second current source and the resistor, and an output coupled to a gate of the FET.

Aspect 30: The wireless communication device of any one of aspects 26-29, wherein the RF transmit signal is in the millimeter wave frequency band, and wherein the at least one antenna comprises a phased array antenna configured to generate radiation beamforming based on the RF transmit signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A method, comprising:
   generating a first current flowing from a first voltage rail to a second voltage rail;
   generating a second current flowing from a node to the second voltage rail, wherein the second current is related to a power level of a radio frequency (RF) signal;
   generating a third current related to the second current, wherein the third current flows from a third voltage rail to the second voltage rail via the node; and
   generating a power-indicating voltage indicative of the power level of the RF signal, wherein the power-indicating voltage is related to the second current.

2. The method of claim 1, wherein generating the second current comprises generating the second current based on the power-indicating voltage.

3. The method of claim 1, wherein generating the third current comprises controlling a current source to generate the third current based on the power-indicating voltage.

4. The method of claim 1, further comprising generating a fourth current related to a sum of the first, second, and third currents.

5. The method of claim 1, wherein the first current comprises a substantially constant bias current.

6. An apparatus, comprising:
- means for generating a first current flowing from a first voltage rail to a second voltage rail;
- means for generating a second current flowing from a node to the second voltage rail, wherein the second current is related to a power level of a radio frequency (RF) signal;
- means for generating a third current related to the second current, wherein the third current flows from a third voltage rail to the second voltage rail via the node; and
- means for generating a power-indicating voltage indicative of the power level of the RF signal, wherein the power-indicating voltage is related to the second current.

7. The apparatus of claim 6, wherein the means for generating the second current comprises means for generating the second current based on the power-indicating voltage.

8. The apparatus of claim 6, wherein the means for generating the third current comprises means for controlling a current source to generate the third current based on the power-indicating voltage.

9. The apparatus of claim 6, further comprising means for generating a fourth current related to a sum of the first, second, and third currents.

10. The apparatus of claim 6, wherein the first current comprises a substantially constant bias current.

* * * * *